(12) United States Patent
Tahon et al.

(10) Patent No.: US 6,268,058 B1
(45) Date of Patent: *Jul. 31, 2001

(54) SECURITY CARD COMPRISING A THIN GLASS LAYER

(75) Inventors: Jean-Pierre Tahon, Leuven; Bart Verlinden, Boutersem; Leo Vermeulen, Herenthout; Herman Van Gorp, Tielen, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/296,381

(22) Filed: Apr. 23, 1999

Related U.S. Application Data

(63) Continuation-in-part of application No. 09/177,505, filed on Oct. 23, 1998, now Pat. No. 6,120,907.

(30) Foreign Application Priority Data

Oct. 24, 1997 (EP) .................................................. 97203312
Sep. 9, 1998 (WO) .................................. PCT/EP98/05748
Sep. 22, 1998 (EP) .................................................. 98203173

(51) Int. Cl.$^7$ ...................................................... B32B 3/00
(52) U.S. Cl. ........................ 428/426; 428/432; 428/433; 428/913; 430/270.12; 430/495.1; 430/945; 369/283; 369/288
(58) Field of Search ..................................... 428/426, 432, 428/433, 688, 689, 913, 64.1, 64.4, 64.5; 430/270.12, 495.1, 945; 369/283, 288

(56) References Cited

FOREIGN PATENT DOCUMENTS 63-074136 * 4/1988 (JP) .
63-074137 * 4/1988 (JP) .

* cited by examiner

*Primary Examiner*—Elizabeth Evans
(74) *Attorney, Agent, or Firm*—Breiner & Breiner

(57) ABSTRACT

A security card is disclosed which comprises a laminate of a flexible glass layer and a support, characterised in that the glass layer has a thickness of not more than 350 μm. The thin glass layer has sufficient flexibility to allow substantial bending of the card without causing breakage of the glass. In addition, the glass layer acts as a security feature because delamination in order to falsify information stored in the card is very difficult without breaking the glass. The glass is also an efficient barrier layer protecting the information stored in the card from mechanical damage and from degradation due to permeation of gases such as oxygen or water vapour.

10 Claims, No Drawings

SECURITY CARD COMPRISING A THIN GLASS LAYER

This application is a continuation-in-part of Ser. No. 09/177,505 now U.S. Pat. No. 6,120,907 issued Sept. 19, 2000.

FIELD OF THE INVENTION

The present invention relates to a security card which is difficult to counterfeit because it comprises a laminated thin glass layer as a security feature.

BACKGROUND OF THE INVENTION

Security cards are widely used for various applications such as identification purposes (ID cards) or financial transfers (credit cards). Such cards typically consist of a laminated structure consisting of various plastic layers wherein one or more layers carry information, e.g. alfanumeric information, logo's, a picture of the card holder, etc. Writable cards wherein the user can store random information are also known, e.g. cards comprising a magnetic strip, optically-recordable cards or cards comprising an electronic chip, sometimes called 'smart cards'.

A principal objective of such security cards is that it cannot be easily modified or reproduced in such a way that the modification or reproduction is difficult to distinguish from the original. Therefore, security cards are provided with security features which are difficult to modify or reproduce, e.g. a "security seal" between the information layer and a protective sheet bonded to it. Upon an attempt to separate the protective sheet from the information layer, the security seal is destructed or removed so that it becomes clear that the information carried by the card has been tampered with or altered. Such a security seal can e.g. be provided by applying heat-sealable polymers so as to obtain a sealed envelope-type pouch, as described in e.g. U.S. Pat. No. 4,322,461 and references therein.

A problem associated with information recording materials is their susceptibility to mechanical impact which may cause defects such as scratches and may result in a considerable loss of the recorded data. The recordable layer of most of these security cards comprise a plastic foil as protective layer on top of the recording medium. The life-time of such recording materials, which is required to be 10 years for some applications, is insufficient because the plastic foil is not an efficient barrier against solvents, oxygen, moisture and other potential causes of data loss.

Some disclosures mention the use of glass as a base material for making a security card. JP-A 60/214996 describes a laser recording card wherein the base material, which carries the recording layer(s), can be glass. EP-A 272875 also describes an optical recording card wherein glass can be used as a constituting layer. In these patent applications, the glass layer is used as a suitable substrate because of its high transparency so that a light source can be used for writing and reading information. However, the glass layers disclosed therein are non-flexible layers which can easily be broken by accident, e.g. by slight bending during handling or while keeping the card in a wallet.

EP-A 669 205 describes a glass/plastic laminate for use as safety glass in vehicles, said laminate comprising a glass pane, an intermediate adhesive layer and a plastic pane, wherein the glass has a thickness from 30 to 1000 $\mu$m. A functional layer can be applied to the glass which, after lamination, is sandwiched between the glass and the plastic layer and is thereby protected from outside influences. Also U.S. Pat. Nos. 3,471,356 and 4,600,640 disclose thin-glass laminates for use in automotive and architectural applications.

SUMMARY OF THE INVENTION

It is an object of the present invention to provide a security card which is difficult to counterfeit and which is well protected against potential causes of information loss such as mechanical impact and permeation of solvents, oxygen, and moisture and which has sufficient flexibility so that it cannot be damaged by bending. This object is realised by the security card defined in claim 1. Preferred embodiments of the present invention are defined in the dependent claims. Further advantages of the present invention will become clear from the description hereinafter.

DETAILED DESCRIPTION OF THE INVENTION

The security card of the present invention comprises a thin glass layer as a constituting layer. The glass layer offers several advantages. First, the glass layer itself is an efficient security feature. Attempts to counterfeit the card by delaminating the constituting layers causes breakage of the thin glass layer, which is easily detectable and difficult to repair. A second advantage is associated with the excellent barrier properties of the glass, which reduces the permeation of gases and liquids efficiently and which is characterised by a high hardness, thereby preventing damage by scratches and other forms of mechanical damage. As a result, information carrying or recording layers in the card are well protected from the environment and the card has a long life-time. In addition, the thin glass has sufficient flexibility so as to enable substantial bending of the card without damaging the glass layer. Finally, the high specific weight of the glass layer as well as its high transparency allows easy detection of its presence so as to distinguish a security card according to the present invention from a conventional, plastic-based security card or from copies made without such a glass layer.

The thin glass layer is a flexible glass layer. The word "flexible" as used herein shall be understood as meaning "capable of being wound around a core without breaking". A preferred glass layer used in the card of the present invention is capable of being wound around a cylindrical core having a radius of 1.5 m without breaking. The basic requirements for obtaining flexible glass are a low thickness and a high strength. The lower the thickness of the glass, the higher is its flexibility and thus the lower the minimum radius of the core around which the glass can be wound without breaking. The maximum thickness of the glass layer which allows bending of the card with a low probability of breakage is dependent on several parameters, such as composition and manufacturing method of the glass as well as composition, thickness, number and position of the other constituting layers of the card. In order to obtain sufficient flexibility, the glass layer used in the security card of the present invention has an upper thickness limit of 350 $\mu$m. Above this limit, the probability of glass breakage is too high to allow sufficient bending. For higher flexibility said thickness is preferably not more than 200 $\mu$m and even more preferably not more than 100 $\mu$m. The minimum thickness is preferably at least 30 $\mu$m, more preferably at least 50 $\mu$m because glass having a lower thickness may be too brittle so that bending the card would cause glass breakage. As indicated above, the lower limit of the glass thickness is dependent on the composition and the manufacturing process of the glass layer.

Flexible glass is known in the art. EP-A 716 339 describes a process using a flexible glass web, which can be wound up around a core so as to obtain a roll of glass. Said glass can be unrolled and coated with a functional layer in a continuous web coating method. Said flexible glass is characterised by (i) a thickness lower than 1.2 mm, (ii) a failure stress (under tensile stress) equal to or higher than $1\times10^7$ Pa and (iii) an elasticity modulus (Young's modulus) equal to or lower than $1\times10^{11}$ Pa.

The glass may be e.g. sodium float glass, chemically strengthened glass or borosilicate glass. Such glass can be made by squeezing semi-molten glass between metal rollers to produce a thin web. U.S. Pat. No. 4,388,368 describes the following method to produce flexible glass sheets. A soda lime glass ($Na_2O.CaO.SiO_2$=15:13:72 by weight) molten at 1550° C. is drawn and rolled. The glass thus formed is supported by clips at both ends and heated at about 350° C. Thereafter the glass sheet is stretched to from 1.05 to 10 times the area of the original sheet while blowing a hot blast of air at a temperature lower than the aforesaid heating temperature onto the glass sheet, e.g. about 700° C. In this way, the glass sheet is cooled faster at thin portions, and thereby the thickness of the glass sheet thus stretched is maintained uniform. A similar method has been described in JP-A 58,095,622. In another method, described in JP-A 58,145,627, a web of molten glass is pulled upward and immediately drawn horizontally using large rollers onto the surface of a molten metal bath, followed by gradual cooling. The glass thus obtained has improved flatness.

Chemically strengthened float glass is known to have greater strength than regular float glass. Chemically strengthened glass is glass wherein at both surface layers the original alkali ions are at least partially replaced by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. Known methods for producing chemically strengthened glass are processes wherein glass is exposed to ion exchange conditions as described in e.g. JP-A 56,041,859, GB 1,208,153 and U.S. Pat. No. 3,639,198. More details about chemical strengthening of glass are given in e.g. "Glass Technology", Vol. 6, No. 3, page 90–97, June 1965.

Thin borosilicate glass is very strong compared to regular sodium float glass. Borosilicate glass comprises $SiO_2$ and $B_2O_3$. The detailed composition of some borosilicate glass types has been described in e.g. U.S. Pat. Nos. 4,870034, 4,554,259 and 5,547,904.

Flexible, thin glass is commercially available, e.g. from Pilkington, Corning and from Deutsche Spezialglass AG (Desag, Germany, a Schott Group company). According to the technical brochure "Alkali Free and Low Alkali Thin Glasses", subtitle "AF45 and D263: Thin Glasses for Electronic Applications", published by Desag in 1995, thin borosilicate glass is available in a thickness of 30 $\mu$m, 50 $\mu$m, 70 $\mu$m, 100 $\mu$m, 145 $\mu$m, 175 $\mu$m, 210 $\mu$m, 300 $\mu$m, 400 $\mu$m, 550 $\mu$m and 700 $\mu$m.

The glass layer can also be a pre-broken glass layer or a glass layer comprising crack lines as described in European Patent Application No. 98202380, filed on the 15th of Jul., 1998. Such pre-structured glass is especially preferred when very high flexibility is required. According to a preferred embodiment, the glass does not contain cracks throughout the layer but pre-formed grooves of a certain depth, which is smaller than the thickness of the glass. Said grooves may be formed by e.g. abrasive methods, such as grinding, or by laser engraving. The groove pattern of said pre-structured glass can also be used as a security feature, e.g. by scanning said groove pattern, encoding the scanned pattern into digital information and storing said information in the card (e.g. as a bar code, in a memory chip, a magentic strip, etc) or in a computer file. This information then can be consulted for verification at the moment the card is used, e.g. for identification purposes. A discrepancy between the previously stored information of the groove pattern and the actual pattern in the glass layer of the card is a serious indication that the card is not authentic. For easy scanning, the grooves have preferably a sufficient width, e.g. in the range from 1 to 100 $\mu$m. The groove pattern is preferably scanned in reflective mode for accurate detection of the grooves.

According to the present invention, the glass layer is laminated to a support. The term "support" is used in the meaning of a "self-supporting layer" so as to distinguish it from layers which may be coated on a support but which are not self-supporting. The term "laminate" as used herein shall be understood as "a material consisting of a plurality of bonded layers".

The support has preferentially a thickness between 5 $\mu$m and 850 $\mu$m, more preferably between 100 $\mu$m and 600 $\mu$m. The support can be paper or metal but is preferably a plastic foil e.g. cellulose acetate film, poly(vinyl acetal) film, polystyrene film, polycarbonate film, poly(ethylene terephthalate) film, polyethylene film, polypropylene film, or copolymers thereof, e.g. a copolymer of acrylonitrile, styrene and butadiene. The support is preferably a transparent material.

Methods for laminating the glass to the support are well known. Both layers may be laminated without the use of an adhesive layer by so-called vacuum lamination. In order to obtain an effective bond between the glass layer and the support by vacuum lamination, both these materials are preferably characterised by a low surface roughness, e.g. the support preferably does not contain a so-called spacing agent, which is often introduced in plastic foils or in coatings on foils to prevent sticking.

In addition to vacuum lamination, the use of double-sided adhesive tape or an adhesive layer, obtained by applying e.g. a hotmelt, a pressure- or thermo-sensitive adhesive, or a UV or electron-beam curable adhesive. Alternatively a slightly moistened gelatine layer can also be used as an adhesive layer. More information about suitable adhesive layers is described in WO98/6455, filed on the 7th of Oct. 1998. The adhesive layer may be applied either to the glass sheet, to the support, or to both and may be protected by a stripping layer, which is removed just before lamination. Polyethylene is a highly preferred adhesive, which can be applied as a foil between the glass and the support. The bond between the glass and the support is preferably permanent so that they cannot be separated without breaking the glass layer.

Lamination of the glass layer and the support can be effected manually but preferably is effected in a laminating means called a laminator. A typical laminator comprises a pair of heatable rollers, having an adjustable pressure and moving at a fixed or an adjustable speed. The lamination is carried out by bringing the materials in close contact with each other between the rollers of the laminator, optionally after applying an adhesive layer between said materials.

In addition to the glass layer, the security card may be provided with other barrier layers to reduce permeability of gases such as oxygen or water vapour. Organic as well as inorganic barrier layers are known in the art. Organic barrier layers may comprise e.g. Organically Modified Ceramics as described in Coating, no. 9/98, p.314 and 10/97, p.358, poly(hydroxy amide ethers) such as the compounds described in Macromolecules, vol.31, p.8281 (1998), poly (vinyl alcohol), polyacrylonitrile, poly(vinyl butyral), which may be mixed with an epoxy resin, or gelatin. Inorganic barrier layers are typically thin films of sputtered oxides, e.g. $SiO_x$ or $Ta_2O_5$. The thickness of such inorganic barrier layers is preferably lower than 2 $\mu$m, and preferably about 1 $\mu$m so as to obtain some flexibility. It may be advantageous to combine inorganic and organic barrier layers, e.g. a $SiO_x$ layer overcoated with an Organically Modified Ceramic layer, since the uneven surface of an inorganic layer which is typically applied by vapour deposition or sputtering can be leveled off by overcoating with the organic layer. Said additional barrier layer(s) may be present between the glass layer and the support of the laminate used in the security card of the present invention.

The information layer of the security card is preferably applied on the support before lamination to the glass. Alternatively, the information layer can be provided on the glass before lamination to the support or on one of the sides of the glass/support laminate, obtained after lamination of the glass layer and the support. In order to protect the information layer effectively, a glass layers may be laminated to both sides of the information layer. The information layer may itself act as an adhesive layer between the support and the glass layer. In still another embodiment, the side of the support opposite to the information layer may be laminated to the glass. The information layer may be present over the whole area of the security card or may be a strip in a part of the security card. An information medium can be applied on one side or on both sides of the support or the glass.

In order to improve the adhesion of layers which are applied on the glass, it may be beneficial to add an epoxysilane compound according to the following formula:

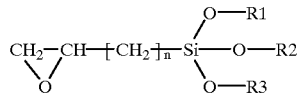

wherein R1, R2 and R3 are hydrogen, an alkyl or a substituted alkyl group and n ranges from 1 to 10, preferable from 1 to 3. Such a compound may be added e.g. to the coating solution of the layer which is to be provided on the glass.

In a preferred embodiment, the information layer of the security card is a laser recording medium, e.g. thin metal layers as described in EP-A-158906. Most preferably, the laser recording layer is a heat-mode recordable medium, which means that the data can be recorded by the local heating of the medium upon exposure to e.g. a laser beam having sufficient power. Said local heating may induce ablation, melting, particle coagulation, decomposition or other (physico-)chemical processes which result in a local change of the optical reflectivity or optical density of the medium so as to obtain recorded data which can be read out by optical means.

Various materials which are suitable as a heat-mode recording medium are known in the art. Particularly suitable materials are metal layers. Ablation of metal layers having a relatively high reflectivity can produce recording spots of lower reflectivity. The thickness of the metal layer is preferably not larger than 700 nm and more preferably in the range of 50 to 600 nm. Tellurium and tellurium alloys have been widely used to form highly reflective thin metal films wherein heating by an incident laser beam locally reduces the reflectivity by pit formation. Reference is made to e.g. the periodical Physik in unserer Zeit, 15. Jahrg. 1984/Nr. 5, 129–130 the article "Optische Datenspeicher" by Jochen Fricke. Tellurium however is toxic and, therefore, other relatively low melting metals such as Ag, Se, Sn and Bi are preferred as a suitable heat-mode recording medium in the security card of the present invention. A survey of other suitable metals is disclosed in U.S. Pat. Nos. 4,499,178 and 4,388,400.

Alternatively, an increase of optical transmission may be obtained in laser beam heated areas of an initially low reflective heat-mode recording medium. Suitable materials for use in the latter embodiment are e.g. mixtures obtained by co-deposition of low melting point metals and sulphides such as GeS or SnS on a transparent support as described e.g. in Journal of Applied Photographic Engineering, Vol. 9, No. 1, February 1983, p. 12. For the production of optical media wherein the information is read in the reflection mode said poor reflective heat-mode recording medium can be applied onto a relatively high melting reflective support or layer, e.g. aluminium layer, carried by a support.

Thin layers of metals, alloys or salts suited for heat-mode recording can be produced by vacuum deposition. In a preferred embodiment of the present invention, a thin vacuum deposited layer of Bi or Ag is used as the recording medium because of its low toxicity, the low energy required for ablation by fusion or evaporation and because these elements form films with ease by vapour deposition. For example, the coating of a bismuth layer by vapour deposition may proceed under reduced pressure in the range of $10^{-2}$ Pa to $8\times10^{-1}$ Pa as described in EP-A- 0 384 041.

A thin layer of Ag can also be deposited using so-called diffusion transfer reversal (DTR) processing. The principles of the DTR process have been described e.g. in U.S. Pat. No. 2,352,014 and in the reference work "Photographic Silver Halide Diffusion Processes" by André Rott and Edith Weyde, The Focal Press, London and New York, (1972). By DTR processing of an information-wise exposed silver halide material, non-developed silver halide present in the photosensitive emulsion layer of the material is transformed with a so-called silver halide solvent into soluble silver complex compounds which are allowed to diffuse into an image receiving element and are reduced therein with a developing agent, generally in the presence of physical development nuclei. Two silver images are thus obtained: a chemically developed negative image in the emulsion layer and a physically developed positive "DTR image" in the nuclei layer. In a preferred embodiment, the nuclei layer is present in the same material as the photosensitive layer, thereby forming a so-called mono-sheet DTR material, though two-sheets embodiments are also known in the art. So when an unexposed DTR material consisting of a support, a silver halide emulsion layer and a thin physical development nuclei layer is subjected to DTR-processing, a uniform silver metal layer is deposited in the nuclei layer. The silver metal layer thus obtained can be used as a heat-mode laser recording medium as will be demonstrated in the examples.

In addition to an ablatable metal the heat-mode recording medium may further comprise substances which increase the recording sensitivity, e.g. by lowering the reflectivity or improving the absorption of laser light. Examples of such substances are the metal oxides, sulphides and halides described in e.g. GB 2 036 597. GeS and SnS are preferred for said purpose and may be applied in a thickness depending on the wavelength of the recording light, e.g. in the range of 5 to 100 nm, as anti-reflection layer without disturbing the ablation of the metal layer.

Other compounds suitable as the laser recording medium may be composite films, whose reflectivity can be reduced by evaporation, thin films of dyes whose reflectivity can be changed by ablation, dielectric materials whose refractive index can be changed, causing scattering of light when scanned with a laser and photochromic layers of dyes such as bacteriorhodopsine. A preferred medium comprising a laser recordable dye is described in U.S. Pat. No. 5,264,327.

Information can be stored in the recording medium by using a visible light laser such as an Ar or He/Ne laser, a red laser diode, etc., the particular wavelength being selected on the basis of the laser recording medium used. Infra-red lasers are highly preferred because infrared light is affected least by scratches and dirt on the glass layer.

The recording medium has preferably a favourable signal-to-noise ratio, i.e. a high contrast between exposed and unexposed areas, the contrast being defined as the density or reflectivity difference between these areas. Preferably, laser recording is carried out at a speed of at least several thousands bits/s. This generally precludes the use of materials that require long heating times or that rely on slow chemical reactions in the presence of heat, which may permit recording at only a few bits/s.

In reflective type media, the reflectivity of unexposed areas is preferably not less than 50% whereas the reflectivity of a data spot obtained by exposure is preferably less than 10%, thus creating a contrast ratio of greater than five to one. Alternatively data may also be recorded by increasing the reflectivity of the strip. For example the recording laser can melt a field of dull microscopic spikes on the strip to create flat shiny spots. This method is described in SPIE, Vol. 329, Optical Disk Technology (1982) p.202. A spot reflectivity of more than twice the surrounding spiked field reflectivity produces a contrast ratio of at least two to one, which is a sufficient contrast for reading The recording medium is preferably characterised by a high resolution, enabling recorded spots having a size less than 50 $\mu$m, more preferably a size of 5 by 20 $\mu$m or circular spots having a diameter from 5 $\mu$m to 10 $\mu$m. The storage capacity of the laser recording medium is preferably larger than 250,000 bits, and more preferably over one million bits.

The writing laser beam should have sufficient laser pulse energy at the surface of the recording material to create data spots. Typically, 5 to 20 milliWatt is required, depending on the recording material. A 20 milliWatt semiconductor laser, focused to a five micron beam size, may records at temperatures of about 200° C. and is capable of creating spots in less than 25 microseconds. In the read mode, power may be lowered to about 5% of the recording power.

In addition to the recordable information layers described above, the information layer may also be an non-recordable layer. The information layer may also be a non-contiguous layer, e.g. may consist of optical security information such as alfanumerics, patterns, logo's, images which are applied on one of the constituting layers of the card. Optical information can be applied by e.g. printing techniques such as planographic offset printing, gravure printing, intaglio printing, screen printing, flexographic printing, relief printing, tampon printing, ink jet printing, laser printing, thermal transfer printing, dye diffusion thermal transfer printing and toner-transfer printing from electro(photo) graphic recording materials.

An optical information layer may also be present between opaque layers of the card so that the information, being hidden by the opaque layers, cannot be read visually in reflection mode but is only detectable in transmission mode, i.e. by illuminating the card from one side with a light source having sufficient intensity and reading the transmitted image from the other side. Such 'hidden' information may be aligned with another, complementary information layer, which may be present on the outer surface of the card, so that the matching optical patterns, images, etc. in both said layers add up and together constitute an extra security feature.

A lenticular foil may also be present on the security card of the present invention. As described in EP-A 323108, a combination of such a lenticular foil and a plurality of parallel image bands present in an underlying photographic layer is an advantageous security feature, especially when combined with a glass layer according to the present invention. Slight rotation of the card about an axis parallel to the lenticular foil yields changing images as different image bands become visible through the lenses. An intermediate glass layer between the lenticular foil and the image layer does not disturb the optical effect of changing images upon rotation and meanwhile protects the image layer from falsification as well as mechanical damage due to scratches, degradation due to permeating of solvents or gases such as oxyen, water vapour, etc.

The security card can further contain other kinds of security information which may be human or machine readable, e.g. a hologram, a watermark, finger prints, microlettering, a signature or other printed personal data, marks or layers that may be applied with liquid crystals, fluorescent pigments, nacreous pigments giving special light-reflection effects, and/or visibly legible or ultraviolet-legible printing inks as described e.g. in GB-P-1 518 946 and U.S. Pat. No. 4,105,333. Information may also be stored on the card in a memory chip, a radio frequency chip, either contactless or with an antenna, a 1D–2D barcode, a magnetic strip, etc. The security information can be mixed in the same layer or in several layers. The mixing can be carried out by pseudo-random generators using a frequency modulated screen.

Another optional security feature is a digital or optical mask. A digital mask can be an algorithm by which the digital data of a coherent signal (image or text) are changed into a broad-band, unreadable pseudo-random signal. An optical mask, acting as an optical encryption medium, can be a spatial phase mask film comprising a patterned array of diffused and not diffused pixels or a phase distorting medium. At the moment of verification, the user needs to enter e.g. a pin code to select a complimentary optical or digital mask which enables to decode the pseudo-random signals in order to restore the coherent signal.

EXAMPLES

First a mono-sheet DTR imaging element was prepared which consisted of, in the order given, a polyester support, a base layer, a silver halide emulsion layer and a physical development nuclei layer. The polyester support had a thickness of 175 $\mu$m and was provided with a double subbing layer to promote the adhesion of the other layers. The base layer and the silver emulsion layer were coated in a single pass using a cascade coating method and after storage during one week the physical development nuclei layer was coated as a top layer thereon using an airknife coating method.

The coating solution of the base layer had a pH of 5.0 and was coated at a wet thickness of 50 $\mu$m. The base layer contained the following ingredients:

2.84 g/m$^2$ of gelatine;
0.12 g/m$^2$ of a silica matting agent having a diameter between 3.5 and 5.0 $\mu$m;

0.21 g/m² of another silica matting agent having a diameter between 1.3 and 2.1 μm;
0.11 g/m² of carbon powder, added as a dispersion in gelatine;
2.63 g/m² of titanium dioxide powder, also added as a dispersion in gelatine;
0.40 g/m² of dimethylphenidon as a developing agent;
surfactant.

The silver halide emulsion contained cubic crystals, consisting of 78.6 mole % of AgCl, 21.0 mole % AgBr and 0.4 mole % of AgI, which were doped with iridium and rhodium. These crystals were obtained using the well known silver halide precipitation methods by the simultaneous or alternate addition of aqueous solutions of silver nitrate, sodium chloride, potassium bromide and potassium iodide. After precipitation the emulsion was flocculated by the addition of polystyrenesulphonate and lowering of pH to 3.4. The soluble salts were then removed by decantation of the supernatants and washing with water (procedure repeated three times). The silver halide crystals were chemically ripened by adding thiosulphate and a Au³⁺ salt and then digesting during 3.5 hours at 50° C. The silver halide emulsion comprised 185 g/kg of silver halide (expressed as silver nitrate) and 88 g/kg of gelatine and a pH of about 5.2. The silver halide grains had an average diameter of about 0.40 μm.

The above emulsion was coated at a pH of about 4.3, a wet thickness of about 22 μm, a silver coverage of 1.55 g/m² (expressed as silver nitrate) and a gelatine coverage of 1.50 g/m² of gelatine. The emulsion layer further contained the following additional non-gelatine ingredients:
1.68 mg/m² of the following compound as supersensitiser:

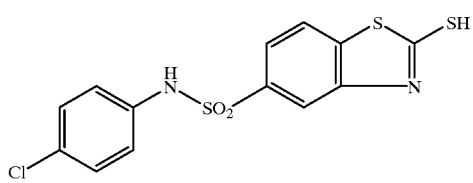

1.34 mg/m² and 0.54 g/m² of the following spectral sensitisers respectively:

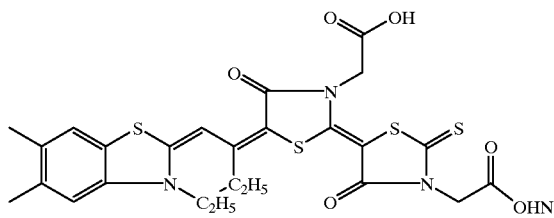

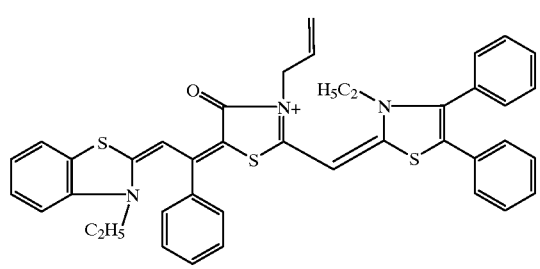

11 mg/m² of the following stabiliser:

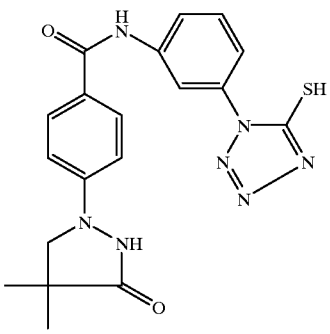

33 mg/m² of an ethylacrylate latex;
240 mg/m² of dimethylphenidone;
196 mg/m² of a silica matting agent having a diameter between 3.5 and 5.0 μm;
226 mg/m² of hydroquinone;
158 mg/m² of formaldehyde;

The physical development nuclei layer contained 0.36 g/m² of hydroquinone, 0.67 g/m² of formaldehyde, 0.66 g/m² of PdS nuclei and surfactants and was coated at a pH of about 8.0 and a wet thickness of about 13 μm.

A strip of the above material was partially exposed through a step-wedge and then processed using standard DTR developer G800 and stabiliser G820 (trade names), available from Agfa-Gevaert N.V., Belgium. In this way a material was obtained which contained two silver layers: in the exposed areas the silver halide crystals were chemically developed to form silver grains in the emulsion layer (the negative image of the step-wedge) and in the unexposed areas finely divided silver grains were formed on the physical development nuclei layer (the reversed image).

Both these silver layers were then used as a laser recording medium in a security card by laminating both sides of the above material to a 100 μm polyester sheet and a 75 μm polyethylene adhesive layer (warm lamination using a standard contact-roller laminator). In summary, the card thus obtained had the structure indicated as Ex.1 in Table 1.

TABLE 1

| Constituting layers of Ex. 1 | Ex. 2 | Ex. 3 |
|---|---|---|
| 100 μm polyester (protecting foil) | = | = |
| 75 μm polyethylene (adhesive layer) | = | = |
| X | X | glass |
| 175 μm polyester (support) | = | = |
| reflective base layer | = | = |
| chemically developed silver layer | = | = |
| physically developed silver layer | = | = |
| X | glass | glass |
| 75 μm polyethylene (adhesive layer) | = | = |
| 100 μm polyester (protecting foil) | = | = |

"X": no layer present; "=": same layer as in Ex. 1.
"glass": 70 μm borosilicate glass, type AF45 from Desag, defined above.

In addition to the comparative example Ex.1, two materials Ex.2 and Ex.3 were prepared according to the present invention. As indicated by the symbol "=" in Table 1, both these materials contained the same constituting layers as Ex.1, with the proviso that Ex.2 contained one additional glass layer between the physically developed silver layer and the polyethylene adhesive layer. No additional adhesive layer was necessary because the gelatine binder of the recording medium adheres very well to the glass surface when moistened with water followed by warm laminating.

Ex.3 contained the same layers as Ex.2 with the proviso that a second glass layer was present at the opposite side of the support, as indicated in Table 1.

The materials were exposed to a Nd:YAG laser (1064 nm) in steps of increasing power of 50, 150, 250, 350 and 450 mW and a scan speed of 2 m/sec. The comparative material Ex.1 showed a gradual differentiation between exposed an unexposed areas, i.e. the physically developed silver layer as well as the chemically developed silver layer were rendered more transparent. The titanium dioxide containing base layer reflects incident light back to the reader, thereby enhancing the visible contrast.

The density difference ($\Delta D$) between D(+), the reflective density of an unexposed area, and D(−), the reflective density of an area which was exposed to the Nd:YAG laser at a power of 450 mW, was used as an indication of the speed of these materials. Surprisingly, the materials of Ex.2 and Ex.3 were characterised by a higher $\Delta D$ value than the material of Ex.1 (values given in the fourth column of Table 2). So the glass layer somehow caused an increase of the visible contrast upon exposure. Though this effect is difficult to explain, it was very reproducible.

Moreover, a significantly increased shelf-life of the materials according to the present invention could be observed by comparing the $\Delta D$ value of fresh material with the $\Delta D$ value of artificially aged material. The $\Delta D$ values in Table 2 indicate that the shelf-life of the unexposed as well as the exposed laser recording medium is significantly increased by the barrier properties of the glass layer(s).

TABLE 2

| Sample | no aging | | | first aging (*), then exposure | | | first exposure, then aging (*) | | |
|---|---|---|---|---|---|---|---|---|---|
| | D (−) | D (+) | $\Delta D$ | D (−) | D (+) | $\Delta D$ | D (−) | D (+) | $\Delta D$ |
| Ex. 1 | 2.59 | 3.15 | 0.56 | 2.62 | 2.92 | 0.30 | 2.59 | 2.96 | 0.37 |
| Ex. 2 | 2.23 | 3.16 | 0.93 | 2.20 | 3.01 | 0.81 | 2.14 | 3.04 | 0.90 |
| Ex. 3 | 2.20 | 3.15 | 0.95 | 2.21 | 3.07 | 0.86 | 2.16 | 3.10 | 0.94 |

(*) storage during 1 week at 67° C. and 50% relative humidity.

The cards Ex.2 and Ex.3 are very difficult to counterfeit because any attempt to delaminate the glass layer(s) in order to alter the data in the silver layers results in glass breakage. The card can be bent, tough, without breaking the glass layer(s).

What is claimed is:

1. A security card comprising a laminate of a flexible glass layer and a support, wherein the glass layer has a thickness of not more than 350 μm.

2. A security card according to claim 1 wherein the glass layer has a thickness of not more than 200 μm.

3. A security card according to claim 1 wherein the glass layer has a thickness of not more than 100 μm.

4. A security card according to claim 1 wherein the glass layer comprises cracks or grooves.

5. A security card according to claim 1 further comprising an optical information layer between two opaque layers.

6. A security card according to claim 1 further comprising a lenticular foil.

7. A security card according to claim 1 further comprising a barrier layer.

8. A security card according to claim 7 wherein the barrier layer comprises an inorganic and an organic layer.

9. A method for making a security card comprising the steps of laminating a glass layer to a support making a crack or groove pattern into the glass layer scanning the crack or groove pattern transforming the scanned pattern into encoded information storing the encoded information.

10. A method according to claim 9 wherein the encoded information is stored in or on the security card.

* * * * *